(12) United States Patent
Singh

(10) Patent No.: US 6,943,633 B2
(45) Date of Patent: Sep. 13, 2005

(54) WIDELY TUNABLE RING OSCILLATOR UTILIZING ACTIVE NEGATIVE CAPACITANCE

(75) Inventor: Prashant Singh, Eden Praire, MN (US)

(73) Assignee: LSI Logic Corporation, Milpitas, CA (US)

(*) Notice: Subject to any disclaimer, the term of this patent is extended or adjusted under 35 U.S.C. 154(b) by 120 days.

(21) Appl. No.: 10/653,593

(22) Filed: Sep. 2, 2003

(65) Prior Publication Data

US 2005/0046496 A1 Mar. 3, 2005

(51) Int. Cl.[7] ................................................ H03B 5/18
(52) U.S. Cl. ........................................ 331/57; 327/264
(58) Field of Search ............................ 331/57; 327/264, 327/272, 278

(56) References Cited

U.S. PATENT DOCUMENTS

| | | | | |
|---|---|---|---|---|
| 5,028,888 A | * | 7/1991 | Ray ............................ | 331/57 |
| 5,558,477 A | * | 9/1996 | Browning et al. ........... | 408/143 |
| 6,556,089 B2 | * | 4/2003 | Wood ........................... | 331/57 |

OTHER PUBLICATIONS

Data Sheet of PA85, High Voltage Power Operational Amplifiers, APEX Microtechnology Oct. 2003.*

* cited by examiner

*Primary Examiner*—Joseph Chang
(74) *Attorney, Agent, or Firm*—Suiter-West-Swantz PC LLO

(57) ABSTRACT

A ring oscillator that uses active negative capacitance at one or more stages of the ring oscillator to adjust the frequency of oscillation. By using a negative capacitance generator, negative capacitance may be placed in shunt with each stage of the ring, thereby reducing the effective input capacitance. Tuning of the ring oscillation frequency is accomplished without changing the bias point of each stage. The ring oscillation frequency may be increased, rather than reduced as in current approaches.

14 Claims, 6 Drawing Sheets

$CIN = -(R1/R2) C$

CIN = -(R1A/R2) C
OR
CIN = -(R1B/R2) C

WIDELY TUNABLE RING OSCILLATOR UTILIZING ACTIVE NEGATIVE CAPACITANCE

CROSS REFERENCE TO RELATED APPLICATIONS

The present invention is related to U.S. patent application Ser. No. 10/647,863 entitled "A Zero Capacitance Bondpad Utilizing Active Negative Capacitance," filed Aug. 25, 2003, being Express Mail Label No. EV 303 410 189 US herein incorporated by reference in its entirety.

FIELD OF THE INVENTION

The present invention generally relates to the field of electronic timing circuits, and particularly to ring oscillators implemented on a substrate.

BACKGROUND OF THE INVENTION

Ring oscillators, as illustrated in FIG. 6, are commonly found on a wide variety of serializer/deserializer integrated circuits, and are very useful because they have a wide tuning range. However, as the data rates continue to increase, and serializer/deserializer circuits must operate with data rates from 1 Gb/s to 6 Gb/s or higher, even the tuning range of the traditional ring oscillator is insufficient. This is because the oscillator frequency of the ring is determined by the delay of the ring, which in turn is affected by the input capacitance and resistance.

Current approaches include adjusting the power supply to the ring, adjusting the current bias of the ring, and switching in additional stages for additional delay. Approaches that adjust the power supply or current bias undesirably affect other properties of the ring oscillator, such as output amplitude, rise and fall time, waveform symmetry, and device noise so as to degrade performance. The addition of stages for delay requires additional area in the layout. Because adding stages act to reduce the oscillation frequency, it does not act to increase the oscillation frequency.

Therefore, it would be desirable to provide a method and circuit for tuning a ring oscillator at high frequencies.

SUMMARY OF THE INVENTION

Accordingly, the present invention is directed to a circuit and method for increasing the oscillation frequency of a ring oscillator.

In a first aspect of the present invention, a ring oscillator includes a plurality of stages in which an output of one stage is an input to a succeeding stage, such that the output of a last stage is input to a first stage, the output of the last stage being an output of the ring oscillator, although other tap points may be used. Each stage includes a circuit having a gain. One or more of the stages has an input electrically connected to an active negative capacitance circuit.

In a second aspect of the present invention, a method for reducing the input capacitance for a stage of a ring oscillator includes forming a ring oscillator that has a plurality of inverting gain delay circuit stages such that an output of one stage is input to one successive stage and adding an active negative capacitance circuit to at least one of the plurality of stages. The method also includes forming an active negative capacitance from a first and a second device through which a capacitive value is derived and scaling the capacitive value through a selection of resistors.

The ring oscillator of the present invention offers several advantages. Because the ring oscillator bias point does not change, the ring properties do not change. The ring oscillator of the present invention offers a compact implementation that does not waste layout area. The ring oscillator has a wide range of tunability. The ring oscillator of the present invention may be used to increase ring oscillation frequency, rather than simply reduce it through excess capacitance.

It is to be understood that both the forgoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Reference will now be made in detail to the presently preferred embodiments of the invention, examples of which are illustrated in the accompanying drawings.

The present invention relates to a ring oscillator that uses active negative capacitance at one or more stages of the ring oscillator to adjust the frequency of oscillation. Tuning of the ring oscillation frequency is accomplished without changing the bias point of each stage. The ring oscillation frequency may be increased rather than reduced as in current approaches.

Figure 1:
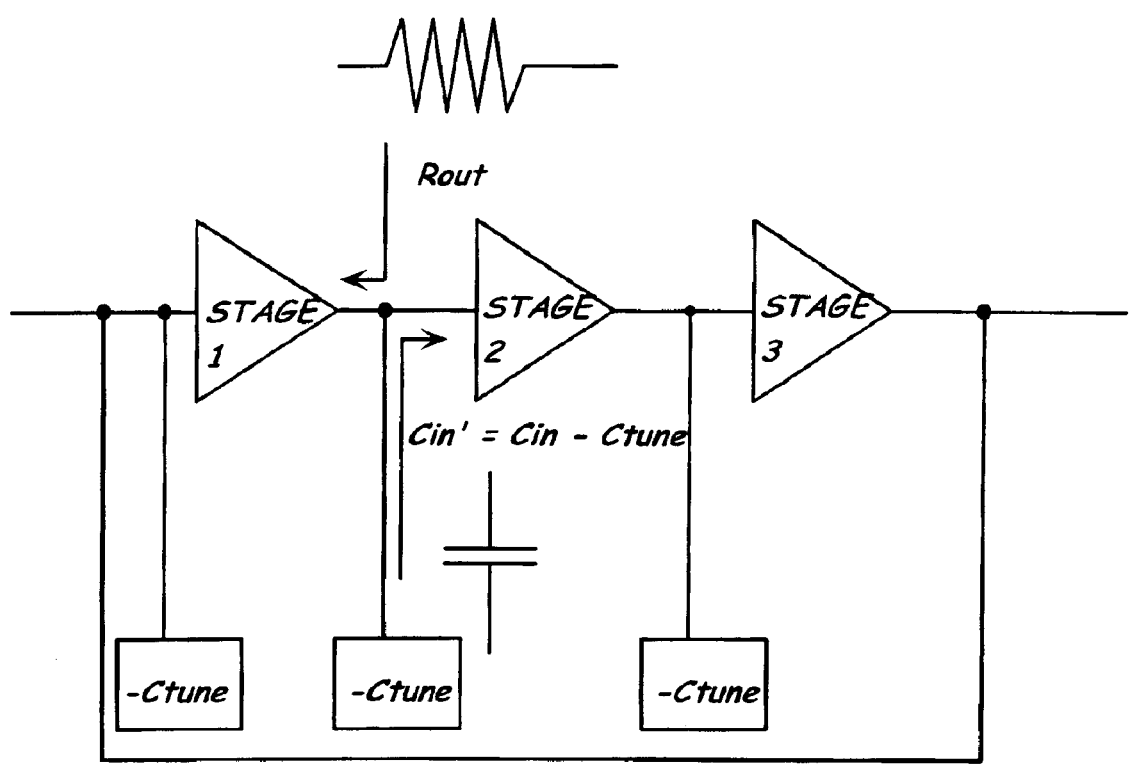
FIG. 1 illustrates a block diagram of an embodiment of a ring oscillation circuit of the present invention.

FIG. 1 shows a functional block diagram of the present invention. Although the ring oscillator is depicted as having three stages, a different number of stages may be used, such as four, five, ten, or the like. If the stages are implemented as inverters through complementary metal oxide semiconductor field effect transistors (CMOS), the number of stages must be an odd number. The stages may be implemented differentially so as to reduce substrate noise, more easily control the delay, and allow flexibility in the number of stages. The output of each stage effectively appears as a resistance Rout. A negative capacitance generator (−Ctune) is placed in shunt with the input of each stage in the ring oscillator. In other embodiment, a portion of the stages may have a negative capacitance generator and a portion may be without a negative capacitance generator. In certain embodiments, each negative capacitance generator may be electrically connectable to a corresponding ring oscillator stage through a switch. By adjusting the value of negative capacitance applied to each stage, the frequency of the ring oscillator may be adjusted without changing the bias point of the stages of the ring because the input capacitance of the stage is reduced by the amount of the negative capacitance.

Figure 2:
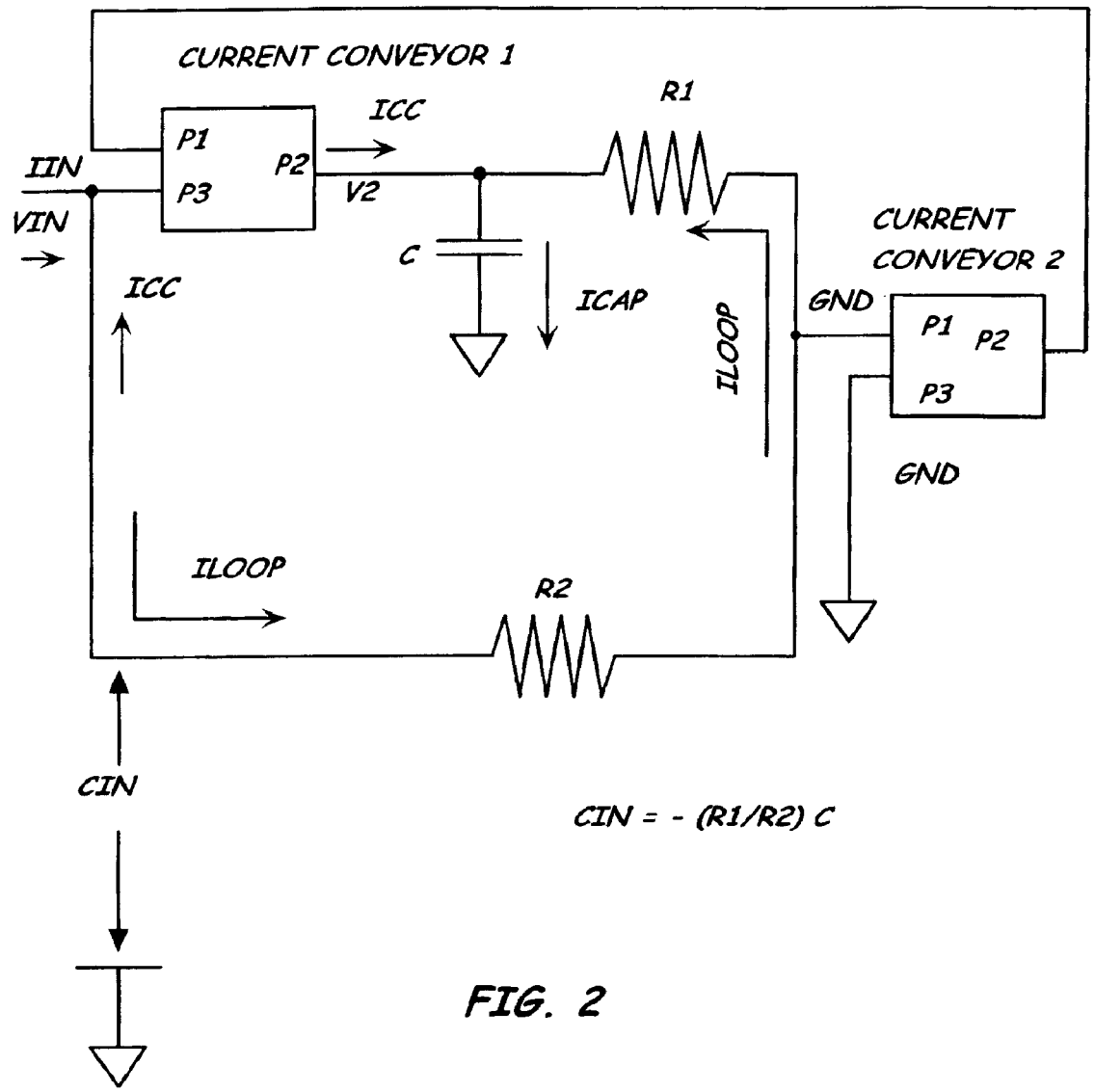
FIG. 2 illustrates a current conveyor model of an active negative capacitance circuit used in the ring oscillation circuit of FIG. 1.

FIG. 2 shows a circuit to generate a negative capacitance. The basic building block of the active negative capacitance circuit (or, negative capacitance generator) is the current conveyor, a three port device. The active negative capacitance circuit model may be depicted as having a first current conveyor and a second current conveyor in which the first current conveyor provides an output signal to a port of the second current conveyor through a first resistor. The first current conveyor output signal is electrically connected to circuit ground through a capacitor. The first current conveyor output signal is further connected to one of two input ports of the first current conveyor through the first resistor and a second resistor. One of the two input ports of the second current conveyor is electrically connected to circuit ground. The second current conveyor output is connected to a port of the first current conveyor. The two current conveyor, two resistor, and one capacitor model yields a relationship of Iin/Vin=−R1/R2×jωC=jωCeff, where Iin is the input current to the input port of the first current conveyor electrically connected to the first current conveyor, Vin is the input voltage to this input port, Ceff is the effective capacitance as viewed from this input port, C is the value of the capacitor, R1 is the value of the first resistor, and R2 is the value of the second resistor. When the ring oscillator of FIG. 1 is used as a voltage controlled oscillator (VCO) in a phase locked loop (PLL), then the frequency of the VCO would need to be tuned in an analog fashion. This may be accomplished by adjusting R1, R2, and C. R1 and R2 may be adjusted by using a MOSFET as a voltage controlled resistor. The source and drain of the MOSFET may be used as the two terminals of the resistor where the gate provides a control voltage. The capacitance C may be tuned by using a varactor (i.e., a voltage variable capacitor). While it is advantageous to keep the current through the ring oscillator stages constant and only adjust the negative capacitance, a user may also tune both the ring oscillator and the active negative capacitance for broader range of tuning.

Figure 3:
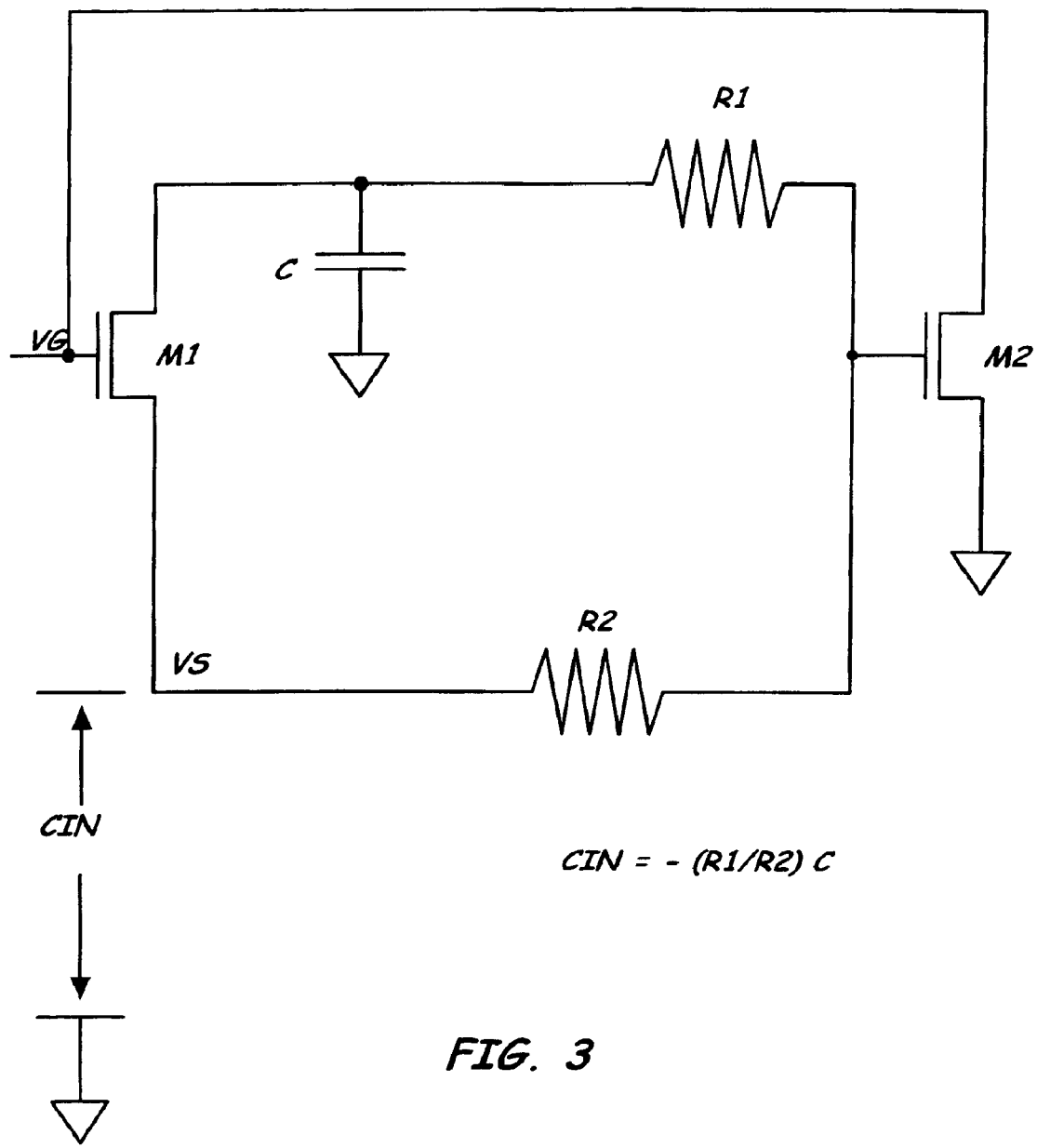
FIG. 3 illustrates an embodiment of an active negative capacitance circuit used in the ring oscillation circuit of FIG. 1.

The analysis of the two current conveyor model may be applied to a two device implementation to provide active negative capacitance. In FIG. 3, devices M1 and M2 may each be implemented as a single transistor or multiple transistors in parallel and are biases at a constant current. In FIG. 3, devices M1 and M2 are n-channel metal oxide semiconductor field effect transistors (MOSFETs). The first current conveyor is implemented by transistor M1 in which the output port is the drain, the input port that provides the effective capacitance is the source, and the input port that receives feedback from the second current conveyor is the gate. The second current conveyor is implemented as transistor M2 in which the drain is the output port that feeds back to the input port of the first current conveyor, the source is an input port electrically connected to circuit ground, and the gate is the other input port that is electrically connected to the resistors. The gate electrodes of the two transistors M1 and M2 are high impedance nodes with no current flow. The current that flows into the drain of transistor M1 or M2 is equal to the currents that flow out of the respective drain. The main difficulty with a MOSFET is that the gate to source voltage drop can prevent the voltage at the gate of the transistor from being identical with the voltage at the source of the same transistor. This may be remedied by using multiple MOSFETs in parallel to reduce the gate to source voltage drop to close to zero. In other implementations, the transistors may be p-channel MOSFETs. In FIG. 2, R1 and R2 are resistors, C is a capacitor, and VS and VG are bias voltages used to turn the circuit on. Power to the resistors R1 and R2 and capacitor C is preferably provided through a current limiting resistor that is either electrically connected to the drain of transistor M1 or the gate of transistor M2. This circuit generates a negative capacitance of value—(R1/R2)×C. The present invention is not limited to MOSFET device implementations.

Figure 4:
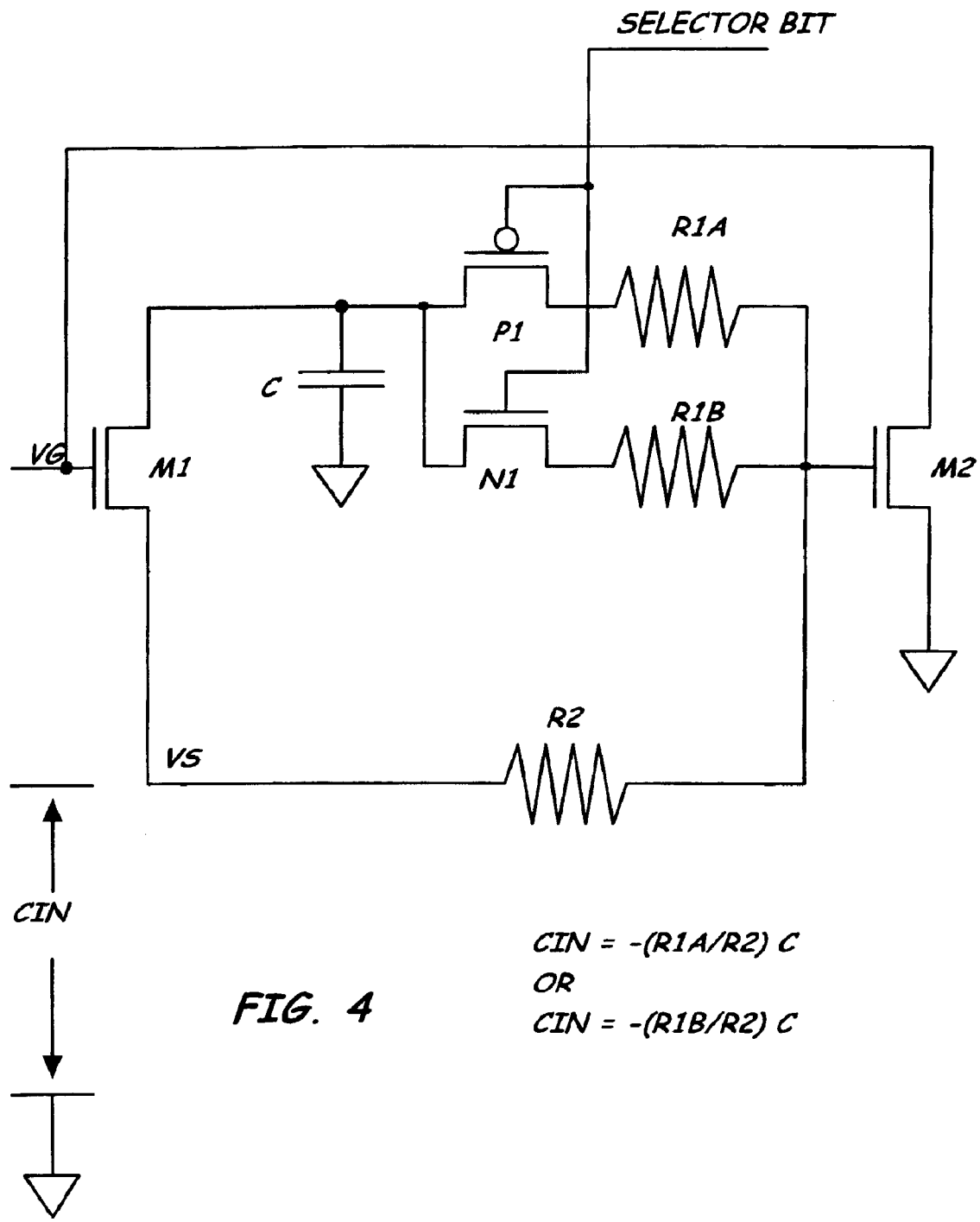
FIG. 4 illustrates an alternate embodiment of an active negative capacitance circuit used in the ring oscillation circuit of FIG. 1.

FIG. 4 shows an alternate embodiment of an active negative capacitance circuit having selectable resistance values. A selector bit has either a high or low polarity such that only one of p-channel transistor P1 or n-channel transistor N1 is turned on at any given time. The ON resistance of the transistor is either negligible in relation to resistor R1A or R1B or is taken into consideration to determine the total resistance. Other embodiments of the active negative capacitance circuit may be implemented.

Figure 5:
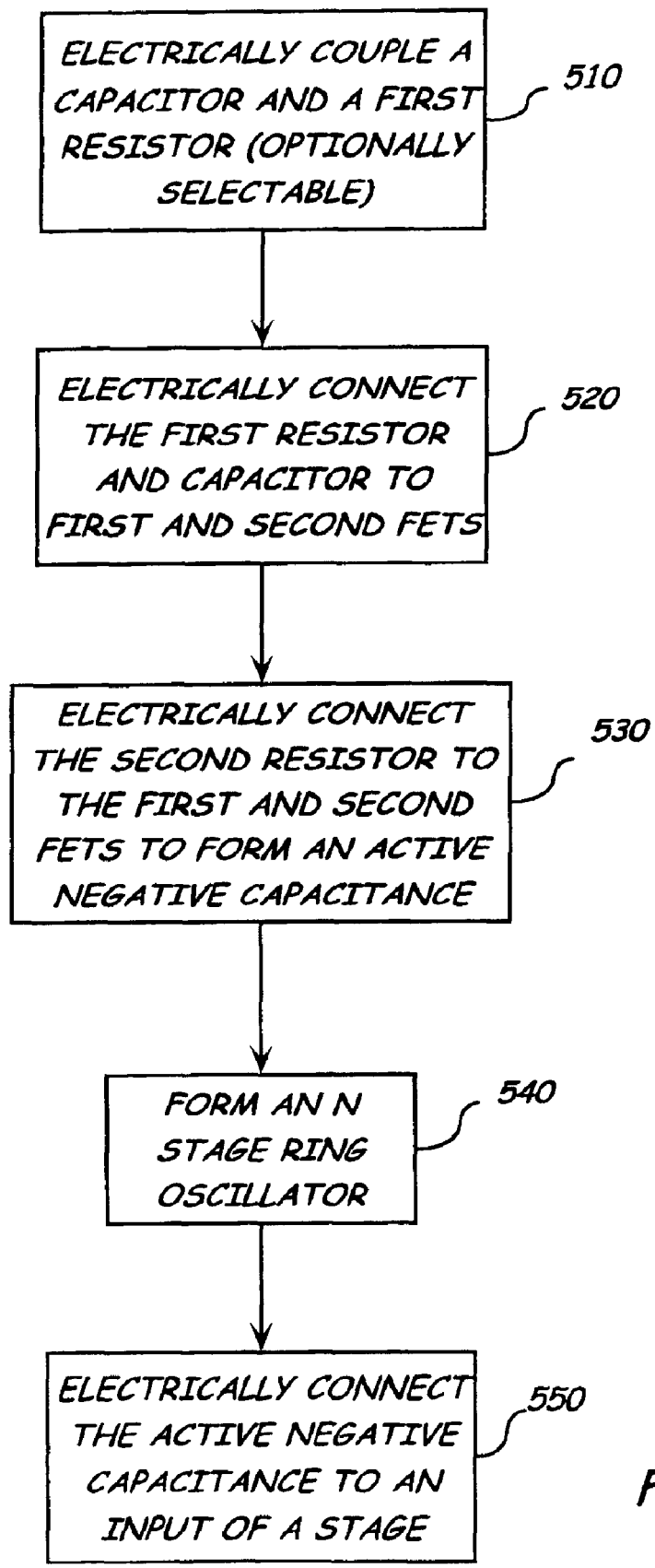
FIG. 5 illustrates an embodiment of a method of the present invention.
Figure 6:
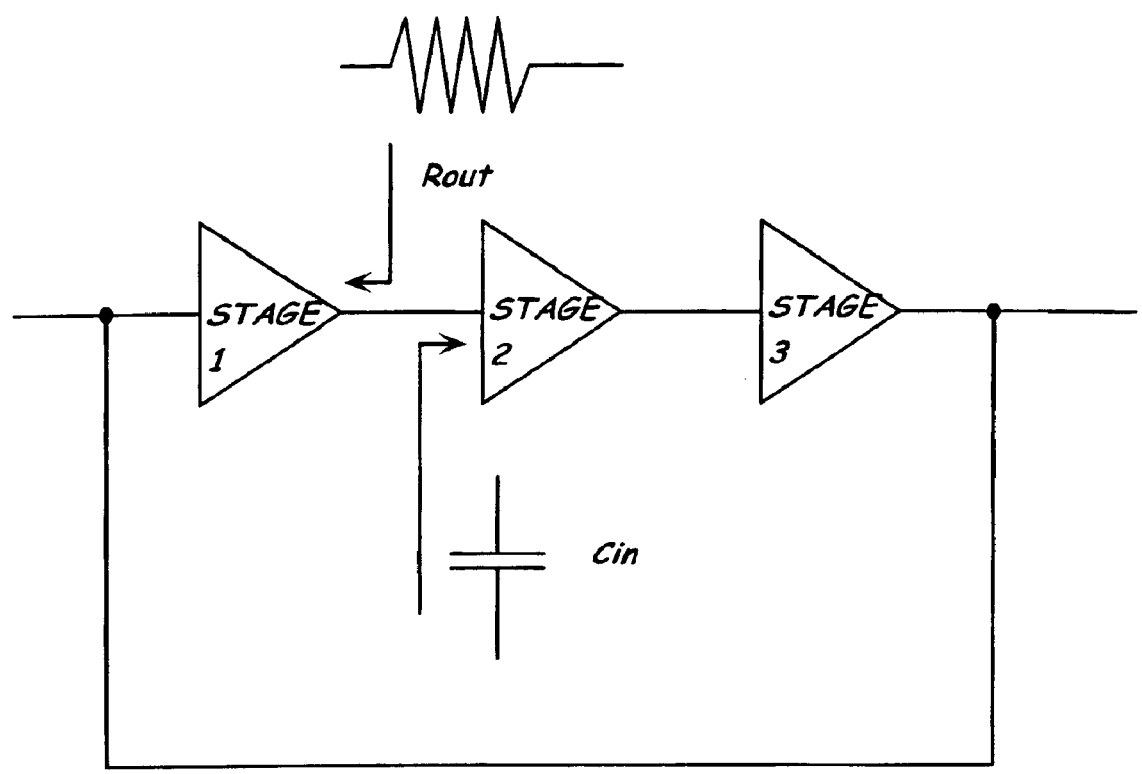
FIG. 6 illustrates a current ring oscillator.

FIG. 5 illustrates an embodiment of the method of the present invention. Numerous variations of the method may be implemented. Generally, a resistor and capacitor are formed 510, first and second field effect transistors are formed, the resistor and capacitor are electrically connected to the first and second field effect transistors 520, another resistor is formed and electrically connected to the first and second field effect transistors 530, the stages of a ring oscillator are formed 540, and the active negative capacitance circuit formed in steps 510–530 is electrically connected to an input of a stage of the ring oscillator 550. Semiconductor techniques are used to form the various components on a substrate. The ring oscillator stage circuitry and the negative active capacitance circuit probably would be formed more or less simultaneously to minimize the number of processing steps. For example, if a ring oscillator stage were formed of an n-channel MOSFET and a p-channel MOSFET, the transistors of both the ring oscillator stage and the active negative capacitance would very likely be formed simultaneously in a patterned layer manner.

It is believed that the present invention and many of its attendant advantages will be understood by the forgoing description. It is also believed that it will be apparent that various changes may be made in the form, construction and arrangement of the components thereof without departing from the scope and spirit of the invention or without sacrificing all of its material advantages, the form hereinbefore described being merely an explanatory embodiment thereof. It is the intention of the following claims to encompass and include such changes.

What is claimed is:

1. A ring oscillator, comprising:
   a plurality of stages in which an output of one stage is an input to a succeeding stage, such that the output of a last stage is input to a first stage, the output of the last stage being an output of the ring oscillator, each stage including a circuit having a gain,
   wherein at least one of the plurality of stages has an input electrically connected to an active negative capacitance circuit, the active negative capacitance circuit including an input device and an output device, the input and output devices being field effect transistors, the active negative capacitance circuit further including a first resistor and a second resistor electrically connected to a first and second field effect transistor, a first end of the first resistor being electrically connected to a drain of the first field effect transistor and a second end of the first resistor is electrically connected to a sate of the second field effect transistor.

2. The ring oscillator of claim 1, wherein one of the plurality of stages is a complementary metal oxide semiconductor inverter.

3. The ring oscillator of claim 1, wherein one of the plurality of stages is a differential amplifier.

4. The ring oscillator of claim 1, wherein a first end of the second resistor is electrically connected to a source of the first field effect transistor and a second end of the second resistor is connected to the gate of the second field effect transistor.

5. The ring oscillator of claim 4, wherein the active negative capacitance circuit further includes a capacitor electrically connected to the drain of the first field effect transistor.

6. The ring oscillator of claim 4, wherein the active negative capacitance circuit further includes a capacitor electrically connected to the source of the first field effect transistor.

7. The ring oscillator of claim 4, wherein a source of the second field effect transistor is electrically connected to circuit ground and a drain of the second field effect transistor is electrically connected to a gate of the first field effect transistor.

8. The ring oscillator of claim 1, wherein the first resistor is selectable.

9. A method for reducing input capacitance for a stage of a ring oscillator, comprising:

providing a ring oscillator that has a plurality of inverting gain delay circuit stages such that an output of one stage is input to one successive stage;

adding an active negative capacitance circuit to at least one of the plurality of stages; and providing an active negative capacitance from a first and a second device through which a capacitive value is derived.

10. The method of claim 9, further comprising scaling the capacitive value through a selection of resistors.

11. The method of claim 10, wherein a value of one of the resistors is selectable.

12. The method of claim 10, wherein the first and second devices are n-channel metal oxide semiconductor transistors.

13. The method of claim 12, wherein a capacitor is electrically connected to a drain of the first device.

14. The method of claim 10, wherein, when the first device is ON, the ON-resistance of the first device and the resistors form a closed loop.

* * * * *

UNITED STATES PATENT AND TRADEMARK OFFICE
CERTIFICATE OF CORRECTION

PATENT NO. : 6,943,633 B2  
APPLICATION NO. : 10/653593  
DATED : September 13, 2005  
INVENTOR(S) : Prashant Singh Page 1 of 1

It is certified that error appears in the above-identified patent and that said Letters Patent is hereby corrected as shown below:

<u>Title page,</u>
Item [12], delete "Singh" and add -- Singh et al. --.
Item [75], Inventors, add -- Brett Hardy --.

Signed and Sealed this

Twentieth Day of June, 2006

JON W. DUDAS
*Director of the United States Patent and Trademark Office*